United States Patent [19]

Iijima et al.

[11] Patent Number: 5,423,317

[45] Date of Patent: Jun. 13, 1995

[54] MAGNETIC RESONANCE IMAGING APPARATUS

[75] Inventors: Naoto Iijima; Kazunari Yamasaki, both of Kyoto, Japan

[73] Assignee: Shimadzu Corporation, Kyoto, Japan

[21] Appl. No.: 282,026

[22] Filed: Jul. 29, 1994

[30] Foreign Application Priority Data

Jul. 31, 1993 [JP] Japan .................................. 5-208335

[51] Int. Cl.6 .................................................. A61B 5/055
[52] U.S. Cl. .................................. 128/653.2; 324/307; 324/309
[58] Field of Search .................. 128/653.2; 324/307, 324/309; 436/173

[56] References Cited

U.S. PATENT DOCUMENTS

| 5,050,609 | 9/1991 | Balaban et al. | 128/653.4 |
| 5,250,898 | 10/1993 | Hu et al. | 324/309 |
| 5,270,652 | 12/1993 | Dixon et al. | 324/309 |
| 5,283,526 | 2/1994 | Spielman et al. | 324/309 |
| 5,339,035 | 8/1994 | Schneider et al. | 324/309 |

FOREIGN PATENT DOCUMENTS

| 0571018A1 | 11/1993 | European Pat. Off. . |
| 3604280A1 | 8/1987 | Germany . |
| 3804446A1 | 8/1988 | Germany . |
| 3919052A1 | 1/1991 | Germany . |
| 3-173529 | 7/1991 | Japan . |

Primary Examiner—Lee S. Cohen
Assistant Examiner—Brian L. Casler
Attorney, Agent, or Firm—Nikaido, Marmelstein, Murray & Oram

[57] ABSTRACT

A magnetic resonance imaging apparatus uses an NMR phenomenon, and includes a number of imaging elements. A made magnet generates a uniform static magnetic field in an imaging space, and first, second and third gradient field coils are provided. These field coils are mounted on the main magnet, and generate three gradient field pulses with magnetic strength varying in three orthogonal directions in the imaging space. An RF coil is provided for transmitting an RF signal to an examinee, and for detecting an NMR signal generated therein. A gradient field control device is connected the gradient field coils for causing the gradient field coils to generate a plurality of gradient field pulses. A first pulse sequence is generated and repeated, while a phase-encoding gradient field pulse is varied. An RF control device is connected to the RF coil for causing the RF coil, in each pulse sequence, to transmit the RF signal and to apply to the RF signal a magnetization transfer contrast pulse having a frequency slightly offset from a resonance frequency of free water protons. The RF control device controls irradiation strength of the MTC pulse based upon variations in the strength of the phase-encoding gradient field pulse, such that the irradiation strength is decreased when a phase-encoding amount is small, and decreased when the phase-encoding amount is large. A data processing device collect data from the NMR signal and reconstruct a sectional image therefrom.

7 Claims, 4 Drawing Sheets

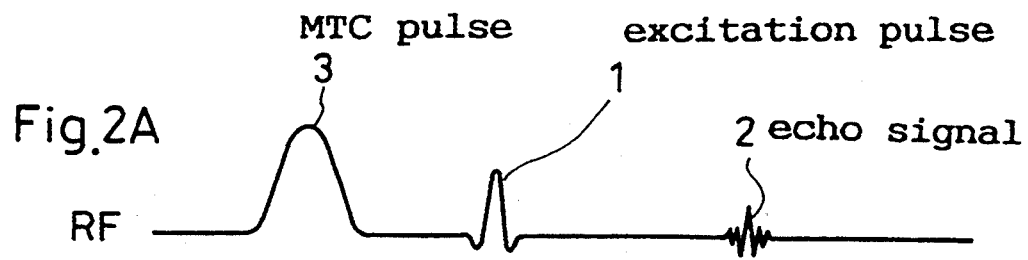
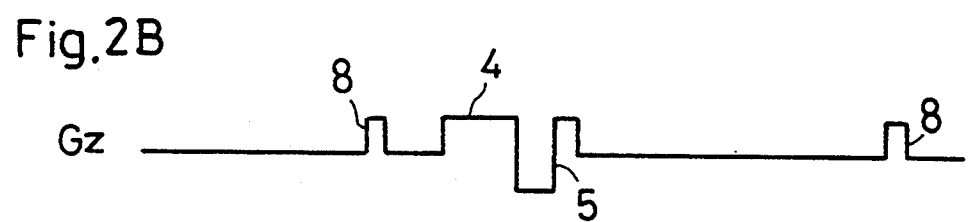
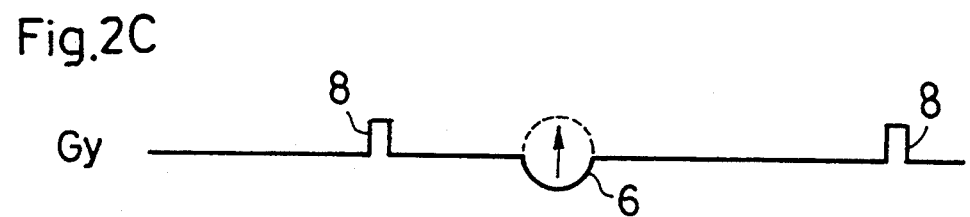
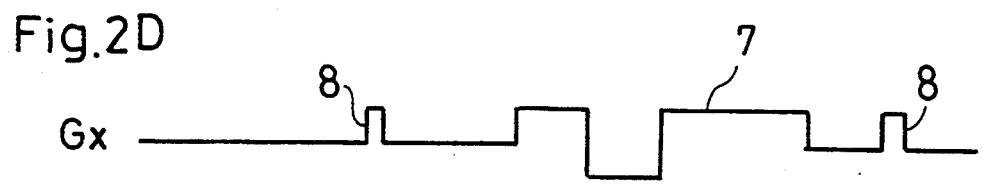
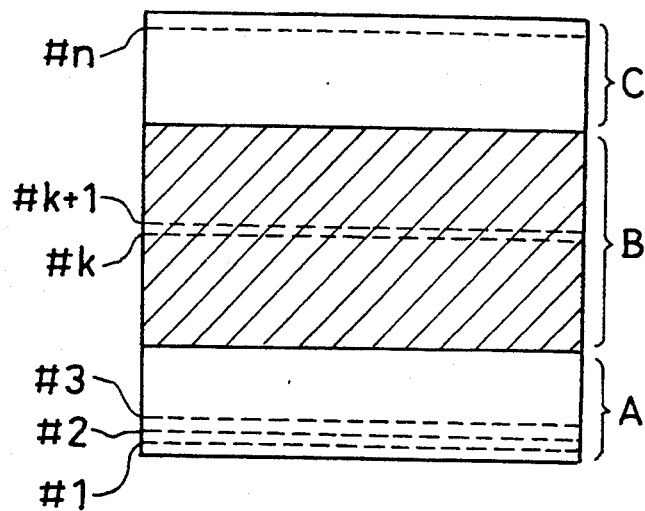

MAGNETIC RESONANCE IMAGING APPARATUS

BACKGROUND OF THE INVENTION

1. Field of the Invention

This invention relates to magnetic resonance imaging apparatus using NMR (nuclear magnetic resonance).

2. Description of the Related Art

Magnetic resonance imaging apparatus, by utilizing the resonance of atomic nuclei, visualize biological tissues based on spin relaxation time differences thereof. Such apparatus are extremely useful in morphological diagnosis in the medical field since they realize images of excellent contrast reflecting the relaxation time differences. Generally, NMR parameters used include proton density p and two types of relaxation time. The latter are longitudinal relaxation time (also called spin-lattice relaxation time) T1 and transverse relaxation time (also called spin-spin relaxation time) T2.

A contrast improving technique for the magnetic resonance imaging apparatus which relies on MT (magnetization transfer) effect has become known in recent years (see, for example, S. P. Wolf and R. S. Balaban, Mag. Reson. Med. vol. 10, p135, 1989; B. S. Hu et al., Mag. Reson. Med. vol. 26, p231, 1992; and Japanese Patent Publication (Unexamined) No. 3-173529). This technique acquires image contrast based on an interaction between protons of free water in biological tissue, and protons of macromolecules such as membranes and proteins and protons of water surrounding them in a movement-restricted manner (hereinafter called restricted water). The image contrast resulting from magnitude of MT is called MTC (magnetization transfer contrast). This MT effect is expected to benefit medical diagnosis not only with improved image contrast but by reflecting tissue properties.

Conventionally, this MTC image is acquired by a method which applies presaturation pulses having a frequency band slightly offset (i.e. having a frequency offset) from the resonance frequency of free water, or presaturation pulses called binominal pulses and having a special shape (these pulses being collectively called MTC pulses herein), to an imaging sequence of the gradient echo or spin echo technique. The binominal pulse is a pulse of special form having a zigzag-shaped frequency spectrum not including the resonance frequency of free water but including a frequency at which the protons of restricted water resonate (Hore, P. J., 1983, A new method for water suppression in the proton NMR spectra of aqueous solutions, J. Magn. Resonance, 54, 539-542).

The protons of restricted water, which rapidly relax transversely (e.g. in transverse relaxation time T2 not exceeding 0.5 msec) and which cannot be visualized by an ordinary method, can be caused to resonate partially and become saturated when irradiated with MTC pulses. The saturation of the protons of restricted water indirectly influences the strength of NMR signals acquired at this time from the protons of free water which slowly relax transversely (e.g. in transverse relaxation time T2 which is at least 30 msec), thereby to change image contrast.

However, when, as in conventional practice, RF pulses having a relatively high power are applied as MTC pulses, RF heating (proportional to a product of MTC pulse irradiation strength and irradiation time) is caused by MTC pulses including high frequency components. This poses a problem, particularly when the human body is examined.

SUMMARY OF THE INVENTION

This invention has been made having regard to the state of the art noted above, and its object is to provide an improved magnetic resonance imaging apparatus which secures the same contrast as in the prior art while suppressing a temperature increase due to RF heating.

The above object is fulfilled, according to this invention, by a magnetic resonance imaging apparatus using NMR phenomenon, comprising:

a main magnet for generating a uniform static magnetic field in an imaging space;

a first to a third gradient field coils for generating three gradient field pulses (i.e. a slice-selecting gradient field pulse, a phase-encoding gradient field pulse and a reading gradient field pulse) with magnetic strength varying in three orthogonal directions in the imaging space;

a RF coil for transmitting a RF signal and detecting a NMR signal;

a gradient field controller for causing the first gradient field coil to generate the slice-selecting gradient field pulse in timed relationship with transmission of the RF signal from the RF coil, causing the second gradient field coil to generate the phase-encoding gradient field pulse, causing the third gradient field coil to generate the reading gradient field pulse substantially synchronously with the NMR signal generated in response to the RF signal, and repeating this pulse sequence while varying the phase-encoding gradient field pulse;

a RF controller for causing the RF coil, in the pulse sequence, to transmit the RF signal and to apply a RF signal (MTC (magnetization transfer contrast) pulse) having a frequency slightly offset from a resonance frequency of free water protons, and controlling irradiation strength of the MTC pulse based on variations in strength of the phase-encoding gradient field pulse, such that the irradiation strength is increased when a phase-encoding amount is small, and decreased when the phase-encoding amount is large; and a data processor for collecting data from the NMR signal detected by the RF coil and reconstructing a sectional image from the data.

When an MTC pulse having a frequency slightly offset from the resonance frequency of free water protons is applied, the spin phase of protons of macromolecules such as proteins and protons surrounding them in a movement-restricted manner, i.e. protons of restricted water, is disarrayed and the protons become saturated. Then, phase information on the spin of free water protons surrounding the restricted water is influenced by the interaction due to the MT effect.

It is only in a pulse sequence of a small phase-encoding amount that signals to which the proton information of the restricted water is added can be acquired. The data obtained in the pulse sequence of a small phase-encoding amount are arranged in a central region of a raw data space (also called a k space) which is a group of data prior to a two-dimensional Fourier transform. The data arranged in the central region are mainly low frequency components which make a substantial contribution to contrast when reconstructing an image. On the other hand, data acquired in a pulse sequence of a large phase-encoding amount are arranged in peripheral regions of the raw data space. The data arranged in the peripheral regions are mainly high frequency components which make a substantial contribution to resolution but little contribution to contrast when reconstructing an image.

That is, the irradiation strength of the MTC pulse is increased in the sequence for acquiring data to be arranged in the central region of the raw data space which govern the contrast of the reconstructed image, i.e. the sequence of a small encoding amount. Thus, an MTC pulse of high signal strength is applied in the imaging sequence having a substantial contribution to contrast, and an MTC pulse of low signal strength in the sequence having a substantial contribution to resolution. As a result, an image is obtained which has a contrast comparable to one obtained when MTC pulses of the same signal strength are applied throughout the imaging sequence, while suppressing a temperature increase due to RF heating.

It is preferred that, in the apparatus according to this invention, the RF controller is operable, in the pulse sequence, to effect an ON/OFF control for applying (i.e. turning on) the MTC pulse when the phase-encoding amount is small, and nullifying (i.e. turning off) the MTC pulse when the phase-encoding amount is large.

With the MTC pulse turned on and off according to the phase-encoding amount determined by the phase-encoding gradient field pulse, RF heating may be suppressed compared with the case of applying the MTC pulse throughout the entire pulse sequence.

Further, the RF controller preferably is cooperable with the gradient field controller to reduce a repetition time of the pulse sequence during which the MTC pulse is applied, to be shorter than a repetition time of the pulse sequence during which the MTC pulse is nullified.

During the pulse sequence in which the MTC pulse is applied, the spin phase of the protons of restricted water is disarrayed, requiring time for the protons to become saturated. During the pulse sequence in which the MTC pulse is nullified, the above time is not required. Thus, repetition times of this sequence may be shortened compared with those of the sequence in which the MTC pulse is applied. As a result, one image may be obtained in a reduced total time period including a series of pulse sequences repeated a predetermined number of times.

It is further preferred that, in the apparatus according to this invention, the RF controller is operable to control the irradiation strength of the MTC pulse based on variations in strength of the phase-encoding gradient field pulse to increase the irradiation strength gradually as the encoding amount diminishes.

The degree of saturation of the restricted water protons relaxing rapidly may be varied by gradually varying the irradiation strength of the MTC pulse. This allows variations of the data in the raw data space to be controlled accordingly. As a result, an image having desired contrast is obtained through adjustment of the irradiation strength of the MTC pulse.

In the apparatus according to this invention, the MTC pulse applied by the RF controller preferably is a binominal pulse.

The binominal pulse is a pulse of special form having a zigzag-shaped frequency spectrum not including the resonance frequency of free water protons but including a frequency at which the protons of restricted water resonate. Since the frequency spectrum is zigzag-shaped when this pulse is used, total power can be reduced. Thus, the total power needed to saturate restricted water may be diminished, and moreover the temperature increase due to RF heating may be suppressed.

In the apparatus according to this invention, the gradient field controller preferably is operable to cause each of the first to third gradient field coils to generate spoiler pulses before generation of the slice-selecting gradient field pulse and after generation of the reading gradient field pulse in the pulse sequence.

When an excitation pulse is applied repeatedly, transverse magnetization could remain with the protons of free water. This causes phantom images (known as artifacts) of shades, contours and the like which do not actually exist to appear in a reconstructed image. Thus, the transverse magnetization remaining with the protons of free water is eliminated by generating spoiler pulses before generation of the slice-selecting gradient field pulse and after generation of the reading gradient field pulse in the pulse sequence. This assures a clear reconstructed image free of artifacts.

It is further preferred that, in the apparatus according to this invention, the gradient field controller is operable to cause the first gradient field coil to generate the slice-selecting gradient field pulse in timed relationship with transmission of the RF signal from the RF coil, thereafter to cause the first gradient field coil to generate a first phase-encoding gradient field pulse, to cause the second gradient field coil to generate a second phase-encoding gradient field pulse, to cause the third gradient field coil to generate the reading gradient field pulse substantially synchronously with the NMR signal generated in response to the RF signal, to repeat this pulse sequence while varying strength of the second phase-encoding gradient field pulse, and to repeat the pulse sequence while varying strength of the first phase-encoding gradient field pulse; the RF controller is operable to control the irradiation strength of the MTC pulse based on variations in strength of the first and second phase-encoding gradient field pulses, such that the irradiation strength of the MTC pulse is increased when the encoding amount is small, and decreased when the phase-encoding amount is large; and the data processor is operable to reconstruct a three-dimensional image from the data collected, based on a three-dimensional Fourier transform.

Positional information in directions of slice plane (X-Y directions) is added by the pulse for the second phase-encoding gradient field and the pulse for the reading gradient field, while positional information in a direction of slice thickness (Z direction) is added by the pulse for the first phase-encoding gradient field. This provides a three-dimensional image having isotropic space resolution (in the direction of slice thickness as well). With the technique based on a two-dimensional Fourier transform, NMR signals can be obtained only from a site of interest having a small thickness in Z direction. This technique based on a three-dimensional Fourier transform enables NMR signals to be obtained from a three-dimensional site of interest. Thus, the NMR signals have an increased absolute amount to realize data of high signal-to-noise ratio. Based on these data, a three-dimensional image of excellent contrast may be obtained.

Further, with the technique based on a two-dimensional Fourier transform, a slice thickness is determined by the frequency band of the excitation pulse and the strength of the pulse for the slice-selecting gradient field. However, because of a limitation to narrowing of the frequency band of the excitation pulse, only a slice thickness in the order of 5 mm can be obtained. With the three-dimensional Fourier transform, on the other hand, resolution is enhanced by applying the pulse for the first phase-encoding gradient field in the direction of slice thickness. Thus, a sectional image having a very small slice thickness in the order of 1 mm may be obtained from the reconstructed three-dimensional image.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

FIGS. 2A through 2D are time charts showing a pulse sequence within one repetition time according to this invention;

FIG. 3 is a view showing a raw data space according to this invention;

DESCRIPTION OF THE PREFERRED EMBODIMENTS

Figure 1:
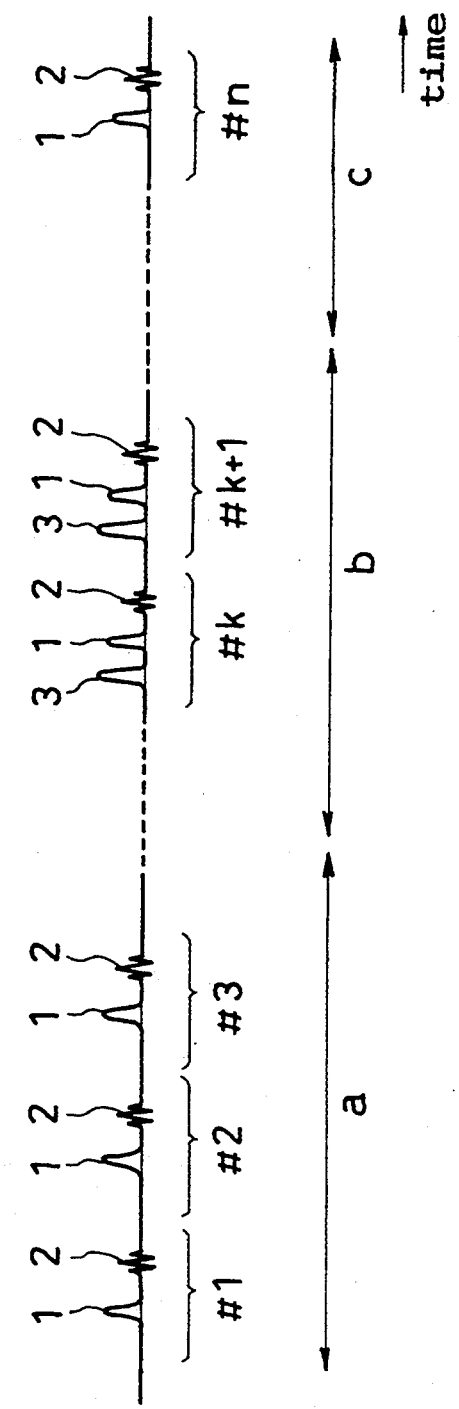
FIG. 1 is a time chart showing an overall pulse sequence according to this invention.

A preferred embodiment of this invention will be described in detail hereinafter with reference to the drawings. FIG. 1 shows repetition of a pulse sequence as shown in FIGS. 2A through 2D, which is executed by a magnetic resonance imaging apparatus shown in FIG. 4. For example, data for 256 lines are collected by repeating the pulse sequence while varying phase-encoding amount in 256 ways, thereby to reconstruct an image of 256 by 256 matrix. In this case, MTC pulses 3 are applied as follows. The phase-encoding amount initially large in negative direction is varied to approach zero gradually and, after reaching zero, to enlarge gradually in positive direction. MTC pulses 3 are not applied during an initial period "a" or final period "c" when the phase-encoding amount is large. MTC pulses 3 are applied only during an intermediate period "b" when the phase-encoding amount is diminished close to zero.

Figure 4:
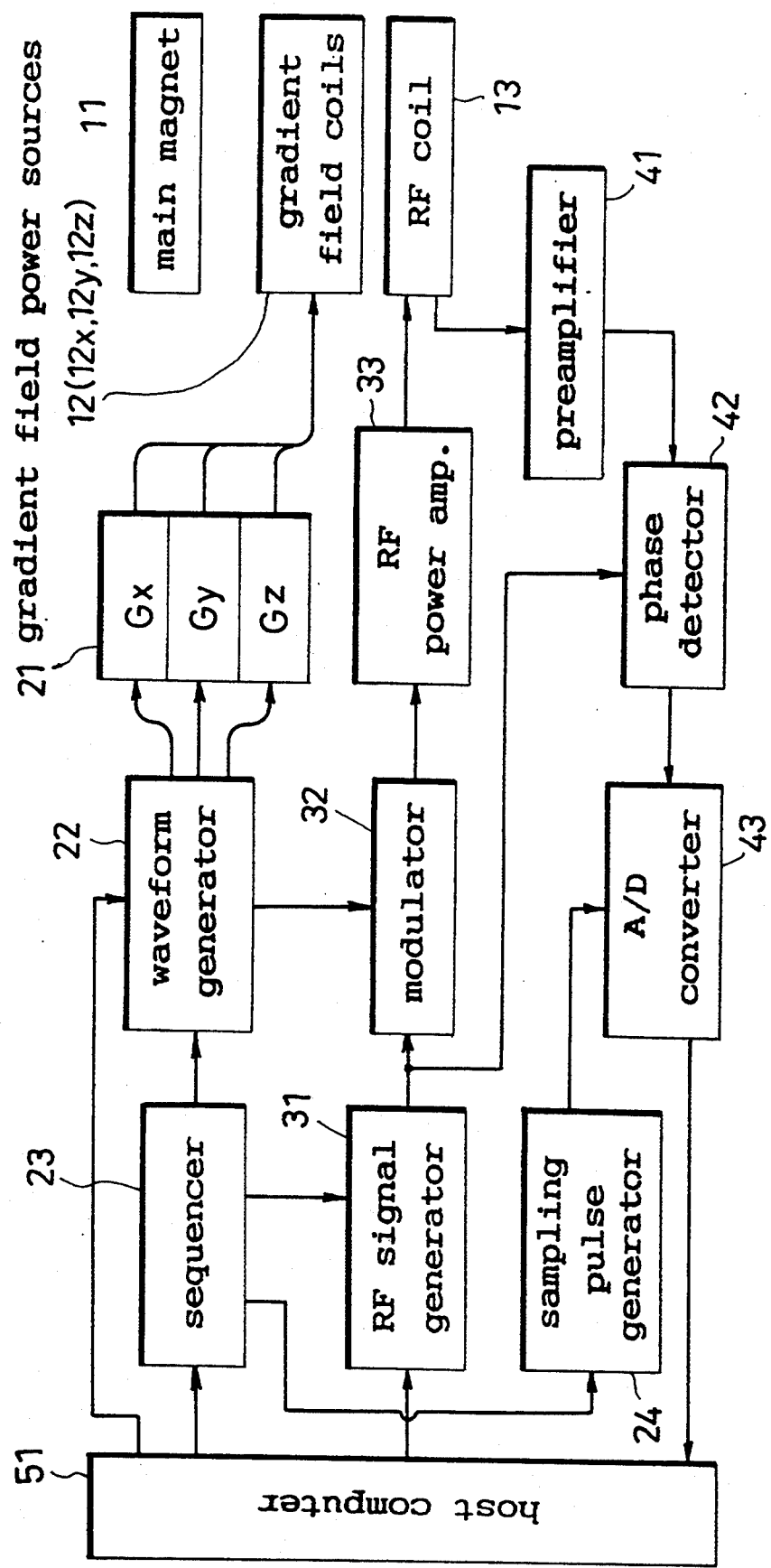
FIG. 4 is a block diagram of a magnetic resonance imaging apparatus according to this invention.
Figure 5A:
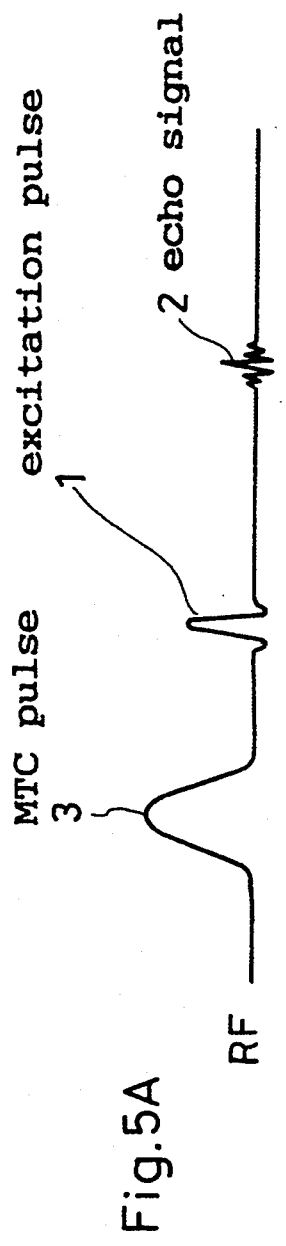
FIGS. 5A through 5D are time charts showing a pulse sequence within one repetition time based on a three-dimensional Fourier transform.
Figure 5B:
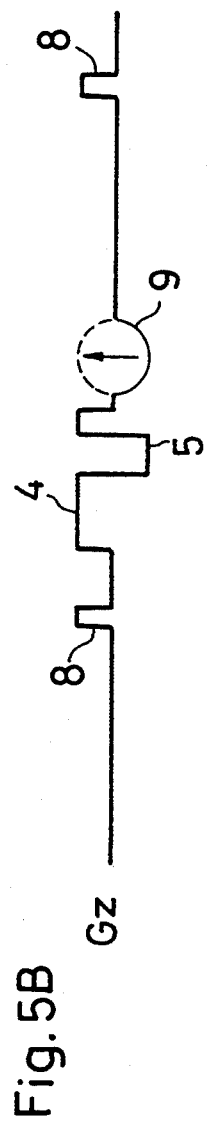
Figure 5C:
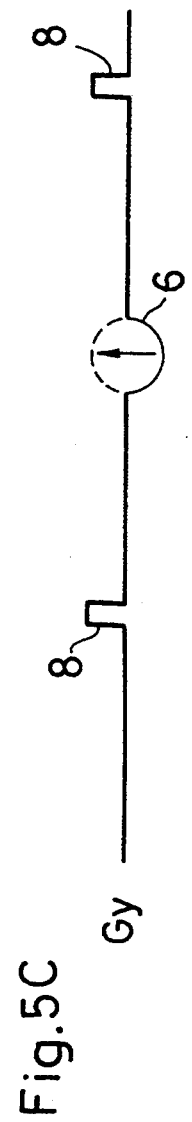
Figure 5D:
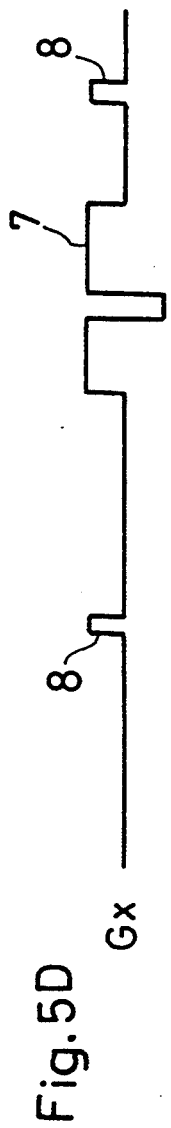

The magnetic resonance imaging apparatus shown in FIG. 4 will be described first. The apparatus includes a main magnet 11 for forming a static magnetic field, and three gradient field coils 12 (i.e. 12x, 12y and 12z) for superimposing gradient magnetic fields on the static magnetic field. The three gradient field coils 12x, 12y and 12z superimpose, on the uniform static field formed by the main magnet 11, pulses for three gradient fields Gx, Gy and Gz (i.e. a slice-selecting gradient field pulse, a phase-encoding gradient field pulse, and a reading gradient field pulse) each having a field strength varying in three orthogonal directions (X, Y and Z). An examinee (patient) is placed in a space where the static and gradient fields are formed, with a RF coil (radiofrequency coil) 13 attached to the examinee.

Gradient field power sources 21 are connected to the gradient field coils 12 to supply power for generating the gradient fields Gx, Gy and Gz. The gradient field power sources 21 receive waveform signals from a waveform generator 22 to control waveforms of the gradient fields Gx, Gy and Gz. The RF coil 13 receives a RF signal from a RF power amplifier 33 to irradiate the examinee with the RF signal. This RF signal results from an amplitude modulation effected by a modulator 32, according to a waveform received from the waveform generator 22, on a RF signal generated by a RF signal generator 31.

The RF coil 13 receives NMR signals generated in the examinee, and transmits these signals through a preamplifier 41 to a phase detector 42. The phase detector 42 detects phases of the signals received, using the RF signal from the RF signal generator 31 as a reference signal. Results of the detection are outputted to an analog-to-digital (A/D) converter 43. The A/D converter 43 also receives sampling pulses from a sampling pulse generator 24 for use in converting the detection results into digital data. The digital data are given to a host computer 51.

The host computer 51 processes the data to reconstruct an image, and determines timing of an overall sequence through a sequencer 23. That is, the sequencer 23, under the control of the host computer 51, transmits timing signals to the waveform generator 22, RF signal generator 31 and sampling pulse generator 24 to determine timing of waveform signal output from the waveform generator 22, timing of RF signal generation by the RF signal generator 31, and timing of sampling pulse generation by the sampling pulse generator 24. Further, the host computer 51 transmits waveform information to the waveform generator 22 to control the waveform, strength and the like of the pulses for the gradient fields Gx, Gy and Gz, and to determine an envelope of the RF signal emitted from the RF coil 13 to the examinee. The host computer 51 also transmits a signal to the RF signal generator 31 to control frequency of the RF signal. Thus, the host computer 51 controls the overall pulse sequence based on an imaging sequence of the gradient echo technique or the like, and determines a frequency and waveform of MTC pulse 3 and whether to apply it or not.

This embodiment employs a pulse sequence based on the gradient echo technique as the imaging sequence as shown in FIGS. 2A-2D. MTC pulse 3 is applied in this imaging sequence. In this imaging sequence, as shown in FIGS. 2A-2D, an excitation pulse 1 having a predetermined flip angle is applied along with a pulse 4 for the slice-selecting gradient field (which is the field Gz in this embodiment). According to the well-known gradient technique, an echo signal 2 is generated by application of a pulse 5 having a polarity inverted from the pulse for the slice-selecting gradient field Gz. A pulse 6 for the phase-encoding gradient field (which is the field Gy in this embodiment) is applied before generation of the echo signal 2, while a pulse 7 for the reading gradient field (which is the field Gx in this embodiment) is applied at the time the echo signal 2 is generated. MTC pulse 3 is applied immediately before the excitation pulse 1, with a carrier frequency determined (i.e. frequency of the RF signal from the RF signal generator 31 is determined) to have a frequency band slightly offset (i.e. having a frequency offset) from the resonance frequency of free water. The excitation pulse 1 has a frequency corresponding to the resonance frequency of free water. In the imaging sequence shown in FIGS. 2A-2D, spoiler pulses 8 are applied to the gradient field coils 12x, 12y and 12z (for the respective fields Gz, Gy and Gx) to disarray the phase at an early stage and a late stage, specifically before the pulse 4 for the slice-selecting gradient field Gz and after the pulse 7 for the reading gradient field Gx. This is done in order to prevent phantom images (known as artifacts) of shades, contours and the like which do not actually exist from appearing in a reconstructed image, which could occur when transverse magnetization remains with the protons of free water as a result of repeated application of the excitation pulse 1 (particularly within a short time period). The spoiler pulses 8 assure a clear reconstructed image free of artifacts.

A waveform of MTC pulse 3 is determined by the waveform generator 22 under control of the host computer 51. With this waveform, the modulator 32 effects an amplitude modulation on the RF signal from the RF signal generator 31 to determine a signal strength of MTC pulse 3. In this embodiment, as noted hereinbefore, the signal strength of MTC pulse 3 is set to zero (turned off) during the initial period "a", maximized during the next period "b", and set to zero again during the final period "c" (see FIG. 1). That is, the pulse sequence shown in FIGS. 2A–2D is repeated "n" times (e.g. 256 times) while varying the phase-encoding gradient field Gy. Normally, the phase-encoding gradient field Gy is controlled to approach zero gradually from a maximum negative amount and to increase gradually in the positive direction after reaching zero. Thus, MTC pulse 3 is off at repetition times #1, #2, #3, ... belonging to the initial period "a", turned on at repetition times #k, #k+1, ... belonging to the next period "b" during which the phase-encoding amount is near zero, and turned off at repetition times ... #n belonging to the final period "c" during which the encoding amount is large in the positive direction.

Data are collected line by line from the echo signals 2 obtained at the repetition times "n". As shown in FIG. 3, the line-by-line data are arranged in a raw data space in the order in which the data are acquired. A two-dimensional Fourier transform is effected on the data arranged two-dimensionally as above, to reconstruct a two-dimensional image. Where, for example, "n" is 256 and 256 samples are taken from one echo signal 2 to obtain 256 data, the raw data space becomes a 256 by 256 matrix and so does the reconstructed image.

The contrast of the reconstructed image is governed mainly by the data arranged in the central region B of the raw data space (which are the data acquired during the period "b"). The data arranged in the peripheral regions A and C (which are the data acquired during the periods "a" and "c", respectively) have little influence on the contrast. This is because the data arranged in the central region B are mainly low frequency components whereas the data arranged in the peripheral regions A and C are mainly high frequency components. Since MTC pulse 3 is applied only during the period "b" in this embodiment, the data to which new information is added by the MT effect are only those arranged in the central region B. Consequently, although MTC pulse 3 is not applied at all of the repetition times "n", the reconstructed image has a contrast comparable to one obtained when MTC pulse 3 is applied at all of the repetition times "n". Total heating of the human body due to RF heating is suppressed since emission of MTC pulse 3 is limited to the period "b". Thus, contrast is enhanced effectively while avoiding the problem of heat generation.

The embodiment described above may be modified in various ways. For example, the data acquired by applying MTC pulse 3 may be any data arranged in the central region of the raw data space, i.e. any data acquired when the phase-encoding amount is small. Thus, the invention is not limited to the order that MTC pulse 3 is turned off during the initial and final periods "a" and "c" and turned on during the intermediate period "b" (i.e. variable with a way in which the phase-encoding amount varies).

During the period in which MTC pulse 3 is turned on (period "b" in FIG. 1), the spin phase of the protons of restricted water is disarrayed, requiring a period of time for the restricted water protons to become saturated. During the periods in which MTC pulse 3 is turned off (periods "a" and "c" in FIG. 1), the repetition times may be shortened since the above time period is not required. As a result, one image may be obtained in a reduced total time period including the repetition times "n".

In the foregoing embodiment, MTC pulse 3 is turned on and off. However, mean values of MTC pulse 3 may be made available by controlling the modulation waveform, thereby to enable the envelope of MTC pulse 3 to be varied gradually according to (the absolute value of) the phase-encoding amount. This enables variations in the degree of saturation of the restricted water protons which relax rapidly, and control of data variations in the raw data space accordingly, thereby to secure an image having desired contrast.

MTC pulse 3 is a RF signal having a frequency slightly offset from the resonance frequency of the free water protons. However, MTC pulse 3 may be a binominal pulse of special form having a zigzag-shaped frequency spectrum not including the resonance frequency of free water but including a frequency at which the restricted water protons resonate. Then, the zigzag-shaped frequency spectrum enables a reduction in the power needed to saturate restricted water. This is effective to suppress the temperature increase due to RF heating still further.

This invention is applicable not only to reconstruction of a two-dimensional image based on a two-dimensional Fourier transform as described above, but to reconstruction of a three-dimensional image based on a three-dimensional Fourier transform. This will particularly be described with reference to FIGS. 5A–5D. First, a pulse 4 for the slice-selecting gradient field Gz is generated synchronously with an excitation pulse 1. Then, the resonance frequency coil 12z having generated the pulse 4 for the slice-selecting gradient field Gz is caused to generate a pulse 9 for a first phase-encoding gradient field. At the same time, the gradient field coil 12y is caused to generate a pulse 6 for a second phase-encoding gradient field Gy. The pulse sequence is repeated "n" times while varying the phase-encoding amount of the second phase-encoding gradient field Gy. Next, the pulse sequence is repeated "n" times again, with the phase-encoding amount of the second phase-encoding gradient field Gy changed from that in the preceding series of pulse sequences. This is repeated a predetermined number of times. A three-dimensional Fourier transform is effected on data thereby arranged three-dimensionally, to reconstruct a three-dimensional image. In each pulse sequence, MTC pulse 3 is applied for a small phase-encoding amount in each of the first phase-encoding gradient field Gz and the second phase-encoding gradient field Gy, and not for a large phase-encoding amount.

According to this modification, positional information in a direction of slice thickness (Z direction) and directions of slice plane (X-Y directions) is added by the pulse 9 for the first phase-encoding gradient field Gy and the pulse 6 for the second phase-encoding gradient field Gz. This provides a three-dimensional image having isotropic space resolution (in the direction of slice thickness as well). This technique based on a three-dimensional Fourier transform enables NMR signals to be obtained from a three-dimensional site of interest. Thus, the NMR signals have an increased absolute amount to realize data of high signal-to-noise ratio. Based on these data, a three-dimensional image of excellent contrast may be obtained. Since resolution is enhanced by applying the pulse for the first phase-encoding gradient field in the direction of slice thickness, a sectional image having a very small slice thickness in the order of 1 mm may be obtained from the reconstructed three-dimensional image.

The present invention may be embodied in other specific forms without departing from the spirit or essential attributes thereof and, accordingly, reference should be made to the appended claims, rather than to the foregoing specification, as indicating the scope of the invention.

What is claimed is:

1. A magnetic resonance imaging apparatus using NMR phenomenon, comprising:

a main magnet for generating a uniform static magnetic field in an imaging space;

first, second, and third gradient field coils mounted on said main magnet for generating three gradient field pulses with magnetic strength varying in three orthogonal directions in said imaging space the pulse being a slice-selecting gradient field pulse, a phase-encoding gradient field pulse, reading gradient field pulse;

an RF coil for transmitting an RF signal to an examinee placed in said imaging space, and detecting a NMR signal generated in the examinee;

gradient field control means connected to said first, second and third gradient field coils for causing said first gradient field coil to generate said slice-selecting gradient field pulse in timed relationship with transmission of said RF signal from said RF coil, causing said second gradient field coil to generate said phase-encoding gradient field pulse, causing said third gradient field coil to generate said reading gradient field pulse substantially synchronously with said NMR signal generated in response to said RF signal, thereby to produce a first pulse sequence, and repeating said first pulse sequence while varying said phase-encoding gradient field pulse;

RF control means connected to said RF coil for causing said RF coil, in each pulse sequence, to transmit said RF signal and to apply to said RF signal an RF signal magnetization transfer contrast pulse (MTC pulse) having a frequency slightly offset from a resonance frequency of free water protons, and for controlling irradiation strength of said MTC pulse based on variations in strength of said phase-encoding gradient field pulse, such that the irradiation strength is increased when a phase-encoding amount is small, and decreased when the phase-encoding amount is large; and data processing means for collecting data from said NMR signal detected by said RF coil and reconstructing a sectional image from said data.

2. An apparatus as defined in claim 1, wherein said RF control means is operable, in said pulse sequence, to effect an ON/OFF control for applying said MTC pulse when said phase-encoding amount is small, and nullifying said MTC pulse when said phase-encoding amount is large.

3. An apparatus as defined in claim 2, wherein said RF control means is cooperable with said gradient field control means to reduce a repetition time of said pulse sequence during which said MTC pulse is applied, to be shorter than a repetition time of said pulse sequence during which said MTC pulse is nullified.

4. An apparatus as defined in claim 1, wherein said RF control means is operable to control said irradiation strength of said MTC pulse based on variations in strength of said phase-encoding gradient field pulse to increase said irradiation strength gradually as said encoding amount diminishes.

5. An apparatus as defined in claim 1, wherein said MTC pulse applied by said RF control means is a binominal pulse.

6. An apparatus as defined in claim 1, wherein said gradient field control means is operable to cause each of said first, second, and third gradient field coils to generate spoiler pulses before generation of said slice-selecting gradient field pulse and after generation of said reading gradient field pulse in said pulse sequence.

7. An apparatus as defined in claim 1, wherein said gradient field control means is operable to cause said first gradient field coil to generate said slice-selecting gradient field pulse in timed relationship with transmission of said RF signal from said RF coil, thereafter to cause said first gradient field coil to generate a first phase-encoding gradient field pulse, to cause said second gradient field coil to generate a second phase-encoding gradient field pulse, to cause said third gradient field coil to generate said reading gradient field pulse substantially synchronously with said NMR signal generated in response to said RF signal, thereby to produce said first pulse sequence, to repeat said first pulse sequence while varying the strength of said second phase-encoding gradient field pulse, and to repeat said first pulse sequence while varying the strength of said first phase-encoding gradient field pulse;

said RF control means is operable to control said irradiation strength of said MTC pulse based on variations in strength of said first and second phase-encoding gradient field pulses, such that said irradiation strength of said MTC pulse is increased when said encoding amount is small, and decreased when said phase-encoding amount is large; and said data processing means is operable to reconstruct a three-dimensional image from said data collected, based on a three-dimensional Fourier transform.

* * * * *